United States Patent [19]

Smith et al.

[11] Patent Number: 6,100,688
[45] Date of Patent: Aug. 8, 2000

[54] METHODS AND APPARATUS FOR NQR TESTING

[75] Inventors: John Alec Sydney Smith, London, United Kingdom; Julian David Shaw, Encinitas, Calif.

[73] Assignee: BTG International Limited, London, United Kingdom

[21] Appl. No.: 09/069,769

[22] Filed: Apr. 30, 1998

Related U.S. Application Data

[62] Division of application No. 08/162,002, filed as application No. PCT/GB92/07004, Jun. 4, 1992, Pat. No. 5,814,989.

[30] Foreign Application Priority Data

Jun. 7, 1991 [GB] United Kingdom .................. 9112290

[51] Int. Cl.$^7$ ..................................................... G01V 3/00
[52] U.S. Cl. .......................... 324/300; 324/307; 324/322
[58] Field of Search .................................... 324/300, 307, 324/318, 301, 322, 309

[56] References Cited

U.S. PATENT DOCUMENTS

| | | | |
|---|---|---|---|
| 4,591,789 | 5/1986 | Glover et al. | 324/300 |
| 5,122,748 | 6/1992 | Oh et al. | 324/300 |
| 5,233,300 | 8/1993 | Buess et al. | 324/300 |
| 5,457,385 | 10/1995 | Sydney et al. | 324/300 |
| 5,583,437 | 12/1996 | Smith et al. | 324/300 |
| 5,814,989 | 9/1998 | Smith et al. | 324/300 |

FOREIGN PATENT DOCUMENTS

| | | |
|---|---|---|
| 0 122 000 A3 | 10/1984 | European Pat. Off. . |
| 0 277 745 A3 | 8/1988 | European Pat. Off. . |
| 0 426 851 A1 | 5/1991 | European Pat. Off. . |
| 13 29 647 | 9/1973 | United Kingdom . |
| 13 39 076 | 11/1973 | United Kingdom . |
| 13 44 084 | 1/1974 | United Kingdom . |
| 13 57 686 | 6/1974 | United Kingdom . |
| 14 48 939 | 9/1976 | United Kingdom . |
| WO 84/04173 | 10/1984 | WIPO . |
| WO 92/21987 | 12/1992 | WIPO . |

OTHER PUBLICATIONS

E. Rommel et al., "Communications–Rotating Frame NQR Imaging," Journal of Magnetic Resonance 91, 1991, pp. 630–636.

S. Matsui et al., "Communicatons–An NQR Imaging Experiment on a Disordered Solid," Journal of Magnetic Resonance 88, 1990, pp. 186–191.

V.S. Grechishkin, "AdiaBatic Demagnetization and Two–Frequency Methods in $^{14}$ N Quadrupole Resonance Spectroscopy," Advances in Nuclear Quadrupole Resonance, vol. 5, 1983, pp. 1–13.

T. Hirschfeld, et al., "Short Range Remote NQR Measurements," Journal of Molecular Structure, 58, 1980, pp. 63–77.

Sergio Pissanetzky, "Zeeman effect of $^{14}$ N nuclear quadrupole resonance with polycrystaline samples," Journal of Chemical Physics, vol. 59, No. 8, Oct. 15, 1972, pp. 4197–4207.

P.C. Lauterbur, "Image Formation By Induced Local Interactions: Examples Employing Nuclear Magnetic Resonance," Nature, vol. 242, Mar. 16, 1973, pp. 190–191.

Buess, et al., "NQR Detection Using a Meanderline Surface Coil", Journal of Magnetic Resonance 92, 1991, pp. 348–362.

Primary Examiner—Christine Oda
Assistant Examiner—Brij Shrivastav
Attorney, Agent, or Firm—Pillsbury Madison & Sutro LLP

[57] ABSTRACT

A method and apparatus for imaging within a sample space an object containing quadrupolar nuclei comprises irradiating the object to excite nuclear quadrupole resonance, applying to the object a magnetic field gradient having a profile Bo(x) such that the square of the profile (Bo(x))2 varies linearly with distance (x), detecting resonance response signals from the nuclei, and deriving an image from the response signals. A method of and apparatus for nuclear quadrupole resonance testing an object, and a method of and apparatus for detecting the presence of a particular substance containing a given species of quadrupolar nucleus, are also disclosed.

22 Claims, 6 Drawing Sheets

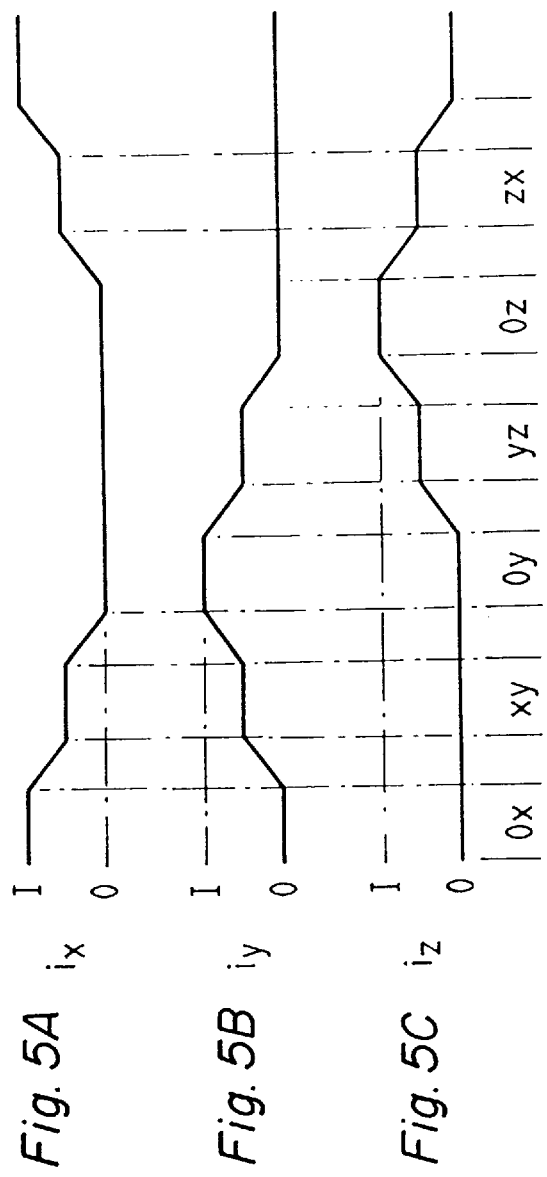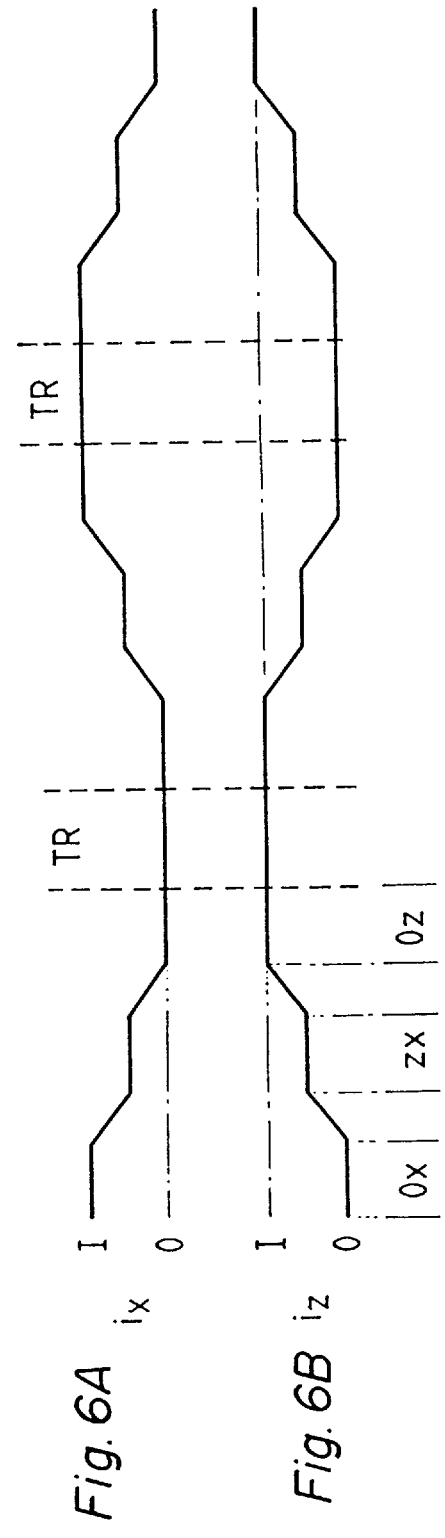

a.

b.

METHODS AND APPARATUS FOR NQR TESTING

This application is a division of PCT national phase Application No. 08/162,002 filed Mar. 28, 1994, now U.S. Pat. No. 5,814,989, based on International Application No. PCT/GB92/01004 filed Jun. 4, 1992 and claims foreign priority from British Application No. 9112290.3 filed in Great Britain on Jun. 7, 1991, the content of all three of which being incorporated hereinto by reference.

BACKGROUND OF THE INVENTION

1. Field of the Invention

The present invention relates to a method of and apparatus for imaging within a sample space an object containing quadrupolar nuclei. The object may, for instance, be a human or animal body or a part thereof; the image may be a simple spin-density image or may be a temperature, pressure or electric field distribution image. For convenience the imaging referred to above will be called NQR imaging. The-present invention also relates to a method of and apparatus for NQR testing an object, and to a method of and apparatus for detecting the presence of a particular substance containing a given species of quadrupolar nucleus.

2. Description of the Related Art

Methods for producing imaqes from the resonances of spin-½ nuclei which have a magnetic moment but no electric quadrupole moment have been extensively developed and described in various books (e.g. P. Mansfield and P. G. Morris, "NMR Imaging in Biomedicine", 1982, Academic Press). Such methods may use linear magnetic field gradients superimposed on a strong, uniform magnetic field. The resonance frequencies of the spin-½ nuclei are linearly dependent on the total magnetic field; this is made to vary linearly with distance across the sample, and the distribution of the substance concerned is derived from the frequencies in the signals produced. Such techniques are commonly called NMR imaging.

Methods for imaging using the resonances of quadrupolar nuclei (which have $I \geq 1$) would be expected to have several advantages. Firstly, the quadrupolar resonances can be detected without using the strong, uniform magnetic field which is needed to make the magnetic resonances of spin-½ nuclei conveniently detectable. Hence the relatively large, expensive and sample-size-limiting magnet structures which are necessary for NMR imaging will not be needed. Avoiding the need for this strong magnetic field also avoids the substantial complications and possible distortions caused by non-uniformity in the field and magnetic interference produced in practical NMR equipment. Secondly, the quadrupolar resonances are more definitely or characteristically associated with specific chemical environments, and it is therefore easier to distinguish results which are due to a particular substance from effects which are due to other substances present in the sample. Methods in which quadrupolar resonances might be observed directly rather than through their interactions with magnetic resonances would be highly suitable for medical use because they do not require patients to be exposed to rapidly changing strong magnetic fields.

Possible disadvantages or limitations on NQR imaging are that the nuclei may be less abundant, may have nuclear quadrupole resonance frequencies lower than the magnetic resonance frequencies of the protons commonly used in NMR imaging, and may have smaller gyromagnetic ratios. This can create a sensitivity problem which has two aspects.

Firstly, it may be difficult to achieve a degree of excitation of the quadrupolar nuclei comparable with the excitation of the spin-½ nuclei which is commonly used in NMR equipment. The radiofrequency power used in medical applications must be limited to avoid undue heating and damage to living tissue. Secondly, the response signals will be weak and of low signal-to-noise ratio, needing sophisticated data processing for their detection.

To our knowledge methods for imaging using quadrupolar resonances have as yet had very little development. Rommel et al (J. Magnetic Resonance 91, 630–636, 1991) reported theoretical reasoning with a conclusion that there would be great practical difficulties in any attempt to use such methods to derive any image from the interaction of a magnetic field gradient with quadrupolar nuclei, considering in particular half-integral spin nuclei of $I \geq 3/2$. As an alternative they reported a method in which the strength of a radiofrequency excitation was varied across a sample in zero magnetic field.

Matsui et al. (J. Magnetic Resonance 88, 186–191, 1990) reported measurements on $^{35}Cl$ nuclei in sodium chlorate in a linear magnetic field, in which an image was derived from the effects of the field on the spectral shape and width of the resonance. It appears that this may be a special case; the $^{35}Cl$ nuclei have $I=3/2$ and their asymmetry parameter in sodium chlorate is zero. Matsui et al. state that "it is practically impossible" for the magnetic field to shift the resonance frequency. This may be incorrect, at least in relation to nuclei other than $^{35}Cl$ in substances other than sodium chlorate.

SUMMARY OF THE INVENTION

According to one aspect of the present invention, in general terms there are provided methods and apparatus for producing an image representing the distribution of a specific substance or local temperatures within an article or in part of a human or an animal body, wherein the article or part of the body is irradiated with a pulse or pulses of radiofrequency energy at or close to a quadrupole resonance frequency of atomic nuclei of $I \geq 1$ in the specific substance and is subjected to at least one magnetic field gradient having a profile which produces a variation (including possibly a splitting) of the resonance frequency which is a linear function of distance in the direction of the magnetic field gradient, response signals from the nuclei are measured and an image is derived by data processing the result of many such tests. According to the invention, preferably either the magnetic field profile is a function $B_o(x)$ of distance x such that its square $[B_o(x)]^2$ is a linear function of x, within a limited sample volume of the article or body, or else the invention relates to a method of imaging using quadrupolar nuclei having integral spin quantum number (I=1, 2, 3, ... ), preferably having unity spin quantum number. $^{14}N$ is a nucleus for which I=1.

According to an aspect of this invention, there is provided apparatus for imaging within a sample space an object containing quadrupolar nuclei, comprising means for irradiating the object to excite nuclear quadrupole resonance, means for applying to the object a magnetic field gradient having a profile B such that $B^n$ varies linearly with distance, n being greater than one, means for detecting resonance response signals from the nuclei, and means for deriving an image from the response signals.

The apparatus may further comprise means for applying to the object a magnetic field gradient having a profile which varies linearly with distance.

This invention arises from our discovery that, surprisingly, for a wide range of substances containing quadrupolar nuclei, a gradient profile having n greater than one (rather than a linear gradient) should be used in NQR imaging since it (rather than a linear gradient) produces a variation in resonance frequency which is a linear function of distance. As will be apparent from the following, for many (possibly the majority of) applications we have discovered that n should be 2 (i.e. a square law gradient), by which is meant that n should be exactly, or close to, two.

Magnetic field gradients in different directions may be applied in sequence to derive sufficient results for the derivation of a two-dimensional or three-dimensional image, each gradient having a profile which makes the resonant frequency vary as a linear function of distance in the direction of the gradient. Where gradients in only two directions are used, the sample or article may be rotated about one of these directions to derive information sufficient for three-dimensional imaging.

The sensitivity and excitation difficulties noted above may in practical terms restrict the species of nuclei which can be imaged, and limit the size of article or body parts to which the present technique may be applied. The present invention is particularly concerned with producing images of the distribution of various specific substances containing $^{14}N$ nuclei. Such nuclei are present in collagen, urea, peptides, proteins, amino acids and many other substances which are important in normal or abnormal human anatomy and/or metabolism, and images representing their distribution in body parts may be useful in the diagnosis or assessment of disease and in monitoring medical treatments. It also appears feasible to use the methods and apparatus of this invention to produce images of substances containing $^{23}Na$, $^{39}K$, $^{35}Cl$ or $^{127}I$ nuclei. For other nuclei such as $^{2}H$, $^{7}Li$, $^{9}Be$, $^{11}B$, $^{17}O$, $^{25}Mg$, $^{27}Al$, $^{51}V$, $^{55}Mn$, $^{59}Co$, $^{75}As$, $^{79}Br$, $^{81}Br$, $^{197}Au$ and $^{209}Bi$, the sensitivity and excitation problems may be more severe and with presently available techniques it is possible that any imaging of these nuclei would be limited to comparatively small and/or inanimate samples.

The quadrupole resonance frequencies are also shifted by temperature variations, and by comparing tests with different magnetic field profiles the technique may be extended to produce images representing the variations of temperature in a sample or body part. This can provide a non-invasive method for measuring or monitoring localized temperatures within a sample or body part, and it may be useful in monitoring and/or controlling treatments which involve localized heating. Imaging of pressure or electric ield variations may be effected following the same principle.

In the sub-molecular environment of compounds or crystals, the nature and disposition of the adjacent electrons and atomic nuclei produce electric field gradients which modify the energy levels and the resonance frequencies of the quadrupolar nuclei. The symmetry or asymmetry of these local electric field gradients is an important factor in any study of nuclear quadrupole resonance, and it is measured by an asymmetry parameter n which can have values from zero to one. For instance, for the ring nitrogen in the explosive RDX, $\eta \approx 0.62$, whilst for the peptide nitrogen in amino acids and polypeptides $\eta \approx 0.4$; the nitrogen in cocaine and heroin is thought to have $\eta \leq 0.1$. The spin quantum number I is another controlling factor. $^{14}N$ and $^{2}H$ nuclei have I=1; nuclei such as $^{11}B$ and $^{75}As$ have I=3/2, and $^{17}O$ and $^{27}Al$ I=5/2, etc.

The case of nuclei having integral spin quantum number is considered first. I=1 nuclei are taken as a representative example, but the principles behind the following analysis, and the conclusions drawn from the analysis, apply to all integral spin quantum number nuclei. In the case of nuclei having I=1 there will be three resonant frequencies $\omega_x$, $\omega_y$ and $\omega_z$ which will always have a relationship $$\omega_x = \omega_y + \omega_z. \tag{1}$$

When first and second-order perturbation theory are applied to a study of these resonance frequencies in an externally applied magnetic field, it appears that there are substantially two cases which can be represented by different mathematical approximations.

For such nuclei in substances having n>0.1, over a considerable range of magnetic field strengths the resonance frequencies of individual nuclei may be expressed by equations, derived from a paper by S. Pissanetzky (Zeeman effect of $^{14}N$ nuclear quadrupole resonance with polycrystalline samples, J. Chem. Phys., Vol. 59, No. 8, p. 4197, 1973), of the form $$\omega_x = (3+\eta)K + (G^2B^2/K).F_x \tag{2}$$

$$\omega_y = (3-\eta)K + (G^2B^2/K).F_y \tag{3}$$

$$\omega_z = 2\eta K + (G^2B^2/K).F_z \tag{4}$$

where $G=\gamma/2\pi$, $\gamma$=the gyromagnetic ratio, and $K=|e^2qQ/4h|$, $e^2qQ/h$ being the quadrupole coupling constant. $F_x$, $F_y$ and $F_z$ are functions involving $\eta$ and the two polar angles $(\theta,\phi)$ specifying the relative orientation of the local electric field gradient with respect to the direction of the applied magnetic field B. Since in general there will be many molecules randomly oriented with respect to the direction of the applied magnetic field, there will be many nuclei with a range of values of $F_x$, $F_y$ and $F_z$ and consequently a range of resonant frequencies from each location with any non-zero value of B; the resonance is broadened. However, the maximum value of the dominant term in the expressions for $F_x$, $F_y$ and $F_z$ is proportional to $1/\eta$, and hence this broadening is comparatively limited for substances which have a relatively high asymmetry parameter $\eta$.

It is possible with much computation to calculate how the resonances of a population of randomly-oriented nuclei will combine to determine the line shape and frequency shift of their observable resonance effect.

The results of our researches are that, in general, the observable resonances will show a frequency shift proportional to $B^2$ with a gradual broadening of the line shape, until a critical field strength $B_2$ is reached; above this field strength the line shape becomes distorted and the frequency shift gradually departs from a strict $B^2$ dependence. The angle $\alpha$ between the directions of the magnetic field B and the radiofrequency excitation field $B_1$ has a significant effect on the onset and nature of these changes, and it affects different lines differently.

We have conducted experiments using pure substances in a uniform magnetic field of adjustable strength to study how the field strength alters the line shape and shift. From such experiments using samples of various explosives containing $^{14}N$ nuclei such as RDX (for the ring $^{14}N$ of which $\eta=0.62$). We have found that the resonant frequency $\omega_x$ does shift in proportion to B over a substantial range of magnetic field strengths. We have also found that above a certain field strength, the resonances we have studied develop a doublet structure when B is perpendicular to $B_1$. Fine structure is also indicated in the results published by Matsui et al. though they did not comment on it. In the case of RDX, both components of the doublet shift in proportion to $B^2$. with different rates; we would expect the same to be true for other substances.

Hence for NQR imaging of nuclei having I=1 in substances having η>0.1, it is preferable to use a magnetic field profile B(x) such that $$[B(x)]^2 = u - vx \tag{5}$$

where u and v are numerical constants. This profile will clearly make the resonant frequency vary as a linear function of distance x. The same principle applies to nuclei with I=2, 3, . . . etc., provided that the appropriate frequency is selected.

We have discovered that such a profile may be produced by the combined effects of a central coil centred around a sample space and one or more offset coils coaxial with the central coil but offset to one side of the sample space, when the total ampere-turns product of the one or more offset coils is substantially greater than the ampère-turns product of the central coil, and the fields of the offset coils and the central coil act in the same direction.

He have also discovered an alternative arrangement which uses two coils of different diameters, both offset to one side of the sample space, when the ampère-turns product of the larger coil is substantially greater than the ampère-turns product of the smaller coil, and the field of the smaller coil opposes the field of the larger coil.

Still considering the case of integral spin quantum number nuclei, substances having η zero or close to zero (say η–0.1) are now considered. Taking again the example of I=1, a different approximation leads to the following equations (see the Pissanetzky paper)

$$\omega_x = 3K + (\eta^2 K^2 + G^2 B^2 \cos^2\theta)^{1/2} \tag{6}$$

$$\omega_y = 3K - (\eta^2 K^2 + G^2 B^2 \cos^2\theta)^{1/2} \tag{7}$$

$$\omega_z = 2(\eta^2 K^2 + G^2 B^2 \cos^2\theta)^{1/2} \tag{8}$$

or the resonance frequencies of individual nuclei. Assuming that the nuclei are randomly oriented, we have deduced that in this case the observable resonance peak will shift in proportion to the field strength B provided that η is small enough or, more particularly, provided that $\eta^2 K^2 \ll G^2 B^2 \cos^2\theta$ (that is, provided that $(GB \cos\theta/(\eta K))^2 \gg 1$).

However, for many substances of practical interest for which η<0.1, $(GB \cos\theta/(\eta K))^2$ can be actually considerably less than one. For instance, in a 10 Gauss field and assuming η=0.05, this ratio equals 0.002 for Heroin and 0.04 for Cocaine. When, as in these cases, this ratio is much less than one, then we have discovered, by use of the Binomial expansion, that, as with η>0.1, the resonance frequency will shift according to $B^2$. The principles adduced above also apply to nuclei with I=2, 3, . . . etc.

Hence, for a majority of the substances of practical interest with nuclei having integral spin quantum number, a magnetic field profile of the form given in Equation 5 is appropriate.

However, there may be some substances for which (GB cos θ/(ηK))² is near unity and for which therefore the above analysis does not hold. Sometimes, dependent on the substance, a profile substantially of the form given in Equation 5 would still be appropriate, with any slight deviations from a precise $B^2$ dependence being accommodated by appropriate minor adjustments to the field gradient profile to give a linear frequency shift. In other circumstances the deviations from a $B^2$ dependence may be so significant that a completely different gradient profile may need to be employed. Such a profile would normally be somewhere between square law and linear (that is, 1<n<2, where n is the power of the profile referred to previously), although there may be some cases where n is actually greater than two.

The case of nuclei having half integral spin quantum number is now considered. I=3/2 nuclei are taken as a representative example, but the principles behind the following analysis, and the conclusions drawn from the analysis, apply to all half integral spin systems. Nuclei with I=3/2 in a single crystal structure in a weak magnetic field B have four quadrupole resonance frequencies given by equations of the form $$\omega_n = \omega_o \pm EB. F_n(\theta, \phi, \eta) \tag{9}$$

where E is a function of γ and η and the four resonances have different functions $F_n$. This leads for single crystals to frequency shifts linearly dependent on the magnetic field strength B.

Hence a linear magnetic field profile will be appropriate for imaging nuclei with I=1, 2, 3 . . . etc. when $(GB \cos\theta)(\eta K))^2 \gg 1$ or nuclei with I=3/2, 5/2, etc. in a single crystal structure. This can be provided by coils in the anti-Helmholtz or Maxwell configuration—two coils of radius R, spaced R apart and connected to produce opposing fields. A system providing linear gradient fields in three orthogonal directions will have three pairs of identica coils symmetrically arranged about the sample space. In such a system complementary magnetic field profiles can be provided by simply reversing the direction of the currents. Such systems may be suitable, for instance, for the imaging of parts of human arms or legs and possibly heads; they should be simpler and less expensive than present NMR imaging instruments.

For substances with I=3/2, 5/2, etc. other than single crystal structures, the dependence of resonance frequency on magnetic field becomes complex and not readily amenable to theoretical analysis. In these circumstances, we propose that the relationship between resonance frequency and magnetic field is predetermined for a specific substance of interest and stored as a "look-up" table. Then a magnetic field profile of the form given in Equation 5 (or otherwise a linear field gradient) may be employed to produce spatial encoding. The image can be derived by appropriate use of the look-up table. Alternatively, a field profile, such as would produce a variation of resonance frequency which is substantially a linear function of distance in the direction of the magnetic field gradient, could be utilised. This profile would usually have a form somewhere between linear and square law (that is, 1<n<2).

By employing the magnetic field profiles described above known methods of NMR imaging can be adapted to NQR imaging, the major simplification being the elimination of the strong background magnetic field which is necessary for NMR experiments.

In NMR imaging it is usual to use radiofrequency pulses of sufficient power to cause a 90° rotation of the magnetisation of the nuclei. The pulse duration $t_w$ is given by the equation $$t_W \frac{\pi}{2\gamma B_1} \tag{10}$$

where $B_1$ is the peak strength of the radio frequency excitation field. There will be other constraints on the pulse duration and so in effect this equation often sets the power required. In NQR experiments the corresponding condition for polycrystalline samples containing spin-1 nuclei is $$t_W = \frac{2\pi}{3\gamma B_1} \quad (11)$$

The gyromagnetic ratio $\gamma$ will usually be much smaller for quadrupole nuclei than for protons, so that the r.f. field strength and power required to satisfy equation (11) will be much greater than that required to achieve the corresponding conditions in NMR imaging of protons. Hence it may be practically preferable or necessary to use pulses of considerably lower power and rotation angle, and to make up for this by accumulating results from more pulses, and probably applying pulses more frequently, so that the interval between pulses ($\tau$) is less than the spin-lattice relaxation time ($T_1$). This may be particularly necessary to avoid tissue damage in medical applications. This will also make the accumulated signal strength less sensitive to variations in the rotation angle over the sample space. Shaped or phase/amplitude modulated pulses can also assist in reducing the r.f. power.

The projection-reconstruction methods of imaging developed from the work of Lauterbur (Nature 242, 190–191, 16/3/73) may be preferred for medical applications as they require only small step-wise changes in the magnetic field gradients.

Variations of temperature may cause frequency shifts comparable with the frequency shifts caused by the magnetic field. This will cause distortion in images of samples which have an inhomogeneous temperature distribution, but this can be corrected. This effect may also be used to advantage as a non-invasive means for imaging or monitoring the temperature distribution within the sample. Over a small temperature range, the variation in frequency is often linear with respect to temperature.

Fourier transformation of a set of results taken in zero magnetic field with a sufficiently short r.f. pulse will therefore give a spectrum which, when compared with one or more spectra of a homogenous uniform temperature sample of the relevant substance, will indicate the range of temperatures present.

Increasing temperature generally shifts the resonances to a lower frequency, so that in any image produced by excitation of the frequency $\omega_x$ without temperature correction, indications of the nuclear density in any hot spot will appear displaced towards the region of lower magnetic field. Repeating the experiment with the field profile reversed (or complementary) will cause the hot-spot signal to appear displaced in the opposite direction, and comparison with the previous image will indicate the position of the hot spot and its temperature.

Variations of pressure or electric field will also cause frequency shifts which may be utilized for imaging purposes.

Where the magnetic field splits any resonance into a multiplet, or where there are two or more resonant frequencies close together, it is advantageous to use excitation signals having a frequency distribution broad enough to excite all resonances or all parts of the multiplet. The response signals will then show a pattern of slow beats at the difference frequencies. In certain cases, e.g. when the line is a simple doublet, it may be desirable to use the frequency of these slow beats as the characteristic to be measured, rather than the frequency of either resonance, because it will usually be more sensitive to variations in field strength and it may be more readily distinguishable.

The disclosure of the preceding paragraph gives rise to a further aspect of the invention which is now discussed. This aspect concerns the method of and apparatus for NQR testing and the method of and apparatus for detecting the presence of a particular substance containing a given species of quadrupolar nucleus referred to previously. It has particular relevance to the detection of $^{14}N$ nuclei in explosives (such as RDX, HMX, TNT or PETN) or narcotics (such as Cocaine or Heroin). The invention might, for example, be embodied in a testing instrument installed at an airport. However, it could, in appropriate circumstances, find use in other areas, such as imaging.

It is known (see T. Hirschfeld and S. M. Klainer, "short range remote NQR measurements". J. Molecular Structure, 58 (1980) 63–77) to conduct NQR tests to detect the presence of a particular substance containing a given species of quadrupolar nucleus (such as $^{14}N$ nuclei) by exciting, using a repeating radiofrequency pulse sequence, nuclear quadrupole resonance at a single resonance frequency of the nuclear species and by detecting the response signals at that resonance frequency.

However, such testing techniques can be inaccurate and can lead either to the detection of too many "false positives" or to the detection of too few actual positives.

According to the further aspect of the present invention, there is provided a method of nuclear quadrupole resonance testing an object, comprising repetitively irradiating the object to excite during each repetition nuclear quadrupole resonance at a plurality of resonance frequencies, and detecting the response signals at each of the resonance frequencies.

By repetitively exciting and then detecting NQR resonance at a plurality of resonance frequencies the accuracy of the testing can be increased without there necessarily being a concomitant proportional increase in test time. The repetition time ($\tau$) of the irradiation is generally limited by the spin-lattice relaxation time ($T_1$) of the substance of interest; $\tau$ may typically need to be at least $3T_1$ to ensure full signal recovery between repetitions. A number of resonances can be excited and their response signals detected within this repetition time. If these response signals are summed, signal-to-noise ratio will generally increase according to the square root of the number of resonance frequencies excited. Thus the invention can afford greater accuracy than has hitherto been achievable without any significant increase in test time.

Suitably, the irradiation may either take the form of radiofrequency pulses centred at a single frequency and having a frequency distribution sufficiently broad to excite all of the relevant resonances (e.g. shaped or phase and/or amplitude modulated pulses) or take the form of radiofrequency pulses at or close to each of the resonance frequencies of interest.

To ensure a rapid test, the repetitions preferably occur at least once every $5T_1$ (where $T_1$ is the spin-lattice relaxation time of the NQR nuclei of interest) and usually more frequently than that (e.g. $\tau \sim 3T_1$). This can ensure that the repetitions are no longer than is necessary to achieve full signal recovery between repetitions. Where $T_1$ varies according to which resonance is being excited, the term "spin-lattice relaxation time" suitably connotes the longer or longest value of $T_1$.

One possible variant of the invention is that the testing is not repetitive, but that tests at the plurality of resonance frequencies overlap.

Hence, preferably, irradiation at one of the resonance frequencies begins before detection at another of the frequencies ends. By overlapping the excitation and detection of the various resonances in this way a somewhat quicker test can be afforded without loss of accuracy. The excitation and detection of the various resonances may suitably be substantially simultaneous.

Preferably, the resonance frequencies are well-resolved, so that there is little or no energy transfer between the various resonances and the maximum signal-to-noise ratio can be attained. However, even if this condition is not fulfilled, signal-to-noise ratio improvements can still be achieved to the extent that saturation of all the overlapping resonances does not occur.

Preferably, the resonance frequencies are components of a multiplet. A multiplet usually connotes two or more resonance frequencies which are relatively close together (usually within a few percent of each other) and are yet well-resolved. Multiplets may arise, for instance, due to crystallographic non-equivalence of otherwise structurally identical NQR nuclei (as is the case with, for example, RDX, TNT and HMX); they may also arise (e.g. Heroin and Cocaine) due to the nearly axially symmetric electric field gradient in which the NQR nuclei are located.

The particular advantage of applying the invention to substances in which the resonance frequencies are components of a multiplet is that the resonance frequencies are usually neither so far apart that more than one radiofrequency probe (coil) and pre-amplifier are required to excite and detect the various resonances nor so close that energy is transferred between one resonance and another. It will be understood that a probe's capability to irradiate at different frequencies depends on its Q-factor. A typical probe might be able to irradiate over a range of 50 kHz without retuning and 500 kHz with retuning. Retuning can be effected in a fraction of a second and may therefore not adversely affect the duration of the tests.

However, even when the resonance frequencies are not components of a multiplet it is still possible to make use of the present invention. For simplicity, the lowest of the resonance frequencies may suitably be, say, at least 50%, preferably 75%, of the highest. With these percentage limitations it may be possible to use the same rf probe and pre-amplifier (although suitable adjustments to both will possibly be necessary). As an example, the explosive PETN (which exhibits no multiplets) has resonance frequencies near 360 and 460 kHz, the lower being within roughly 80% of the higher.

According to a different facet of this further aspect of the invention, there is provided a method of detecting the presence of a particular substance containing quadrupolar nuclei, comprising irradiating the substance to excite nuclear quadrupole resonance at a plurality of resonance frequencies, detecting response signals at each of the resonance frequencies, and providing an alarm signal in dependence on whether nuclear quadrupole resonance is detected at each of the plurality of resonance frequencies.

Aside from the Hirschfeld and Klainer paper mentioned above, other art relevant to this facet of the invention is a book edited by J. A. S. Smith entitled "Advances in Nuclear Quadrupole Resonance" (Vol. 5, 1983, John Wiley & Sons Ltd.)—see pages 1 to 13, United Kingdom Patent Nos. 1448939, 1357686, 1344084, 1339076 and 1329647 and European Patent Application No. 0426851. Attention is also drawn to International Patent Application No. PCT/US 92103116, which bears an earlier priority date, but was published later, than the priority date of the present patent application.

By this facet of the invention, the number of "false positives" (alarm signals erroneously indicating the presence of the substance) can be considerably reduced. If only one resonance is excited and detected, a false positive can readily occur since there is inevitably some outside noise or interference which can produce "spikes" or other features on the instrument output which may appear to be genuine NOR response signals at or near the relevant resonance frequency. However, if the alarm signal is provided in dependence on whether a resonance of the appropriate intensity is detected at each of the plurality of resonance frequencies, the probability of a false positive occurring can be considerably reduced, especially if testing takes place at a significant number of resonance frequencies (say, at least three or four).

Preferably, the alarm signal is provided in further dependence on whether the relative intensities of the response signals at each of the plurality of resonance frequencies match those which would be expected for the particular substance. This measure can further reduce the number of false positives. It is envisaged that this measure may suitably be put into practice by predetermining in separate tests the relevant characteristics of the particular substance and storing these for use in the field.

In a preferred embodiment, the response signals from the different resonances are summed together, and if, on the basis of this summation, the presence of the substance is detected to a given (usually statistically predetermined) degree of probability, a second test is performed in which further irradiation repetitions are effected and the alarm signal is provided in dependence on whether resonance is detected (again to a given, probably different, degree of probability) at each of the plurality of resonance frequencies. If the presence of the substance is not detected to the given degree of probability in the first test, the second test can be omitted. This two-stage procedure can thus afford a quick and yet accurate technique for detecting the presence of a particular substance.

Since resonance frequency varies with temperature, pressure or magnetic field, it may be necessary to take such variations into account by irradiating over a range sufficient to cover all possible variations of resonance frequency which might in practice be encountered.

A further aspect of the invention is now exemplified with reference to the NQR testing of specific substances.

In the case of RDX (cyclo-trimethylenetrinitramine) the multiplicity produced by crystallographic non-equivalence of otherwise structurally identical nitrogen nuclei can be exploited. In the vapor phase, the molecule is said to have $C_{3v}$ symmetry, but this is lost in the solid state, and all three $^{14}N$ quadrupole resonance lines from the ring nitrogen nuclei are well-resolved triplets. The splittings are small (less than 150 kHz for $v_x$ near 5.100 kHz), and, although the individual frequencies vary with temperature, the splittings themselves are almost independent of temperature between −30 and +30° C., varying from 143.52 kHz at the former to 145.49 kHz at the latter.

As suggested above, the signal-to-noise ratio can be increased and the number of false positives considerably reduced by, for example, sequentially pulsing at these three frequencies, separately collecting the free induction decays (f.i.d.'s) and/or echoes and processing each of them. Addition of the resulting Fourier transformed responses or their areas will then increase the signal-to-noise ratio by a factor of $\sqrt{n}$, where n is the number of lines in the multiplet. (It will be appreciated that, in this further aspect of the invention, "n" has a meaning different from that in the first aspect.) For RDX, n=3. By interleaving pulses at each individual frequency, as is described later, the same time can be devoted to accumulating those three signal responses as would be needed for just one. Since the signal-to-noise ratio has been improved by a factor of √3, however, the statistical certainty of detection is greater, and the number of false positives can be reduced.

After each pulse or pulse sequence at a given frequency, the NQR instrument will analyse the absorption peak for its frequency, height, width and area, taking into account possible errors assessed from the noise measured off-resonance. In this example, only if statistically equivalent responses are detected after each excitation frequency has been excited would the instrument provide an alarm signal.

The above technique can be highly discriminatory against noise peaks and interference; only RDX will give equal, or nearly equal, response signals at the three selected frequencies at a given temperature.

Heroin and Cocaine are now considered. We have discovered that Heroin shows a close doublet ($v_x$, $v_y$) near 3,900 kHz and Cocaine a doublet near 960 kHz. In these cases, the splitting arises from the nearly-axially symmetric electric field gradient in which the $^{14}N$ nucleus is located, and not from resolved crystallographic non-equivalence. The present invention still applies, and the signal-to-noise ratio may be increased by √2 in these two cases, although the lines are not completely independent.

TNT in both its monoclinic and orthorhombic forms gives six $v_x$ lines between 850 and 900 kHz due to crystallographic non-equivalence, so n=6. HMX gives two $v_x$ lines between 5000 and 5300 kHz.

We have discovered that PETN gives only one $^{14}N$ $v_x$ signal near 460 kHz, but $v_y$ is nearby at 360 kHz and it may be possible to excite both effectively in the same probe, in which case n=2.

BRIEF DESCRIPTION OF THE DRAWINGS

Embodiments of the invention will now be described, by way of example only, with reference to the accompanying drawings, of which:

FIGS. 5A–5C and 6A–6B are graphical diagrams representing signals used in the operation of the apparatus;

DETAILED DESCRIPTION OF THE PRESENTLY PREFERRED EXEMPLARY EMBODIMENTS

Figure 1:
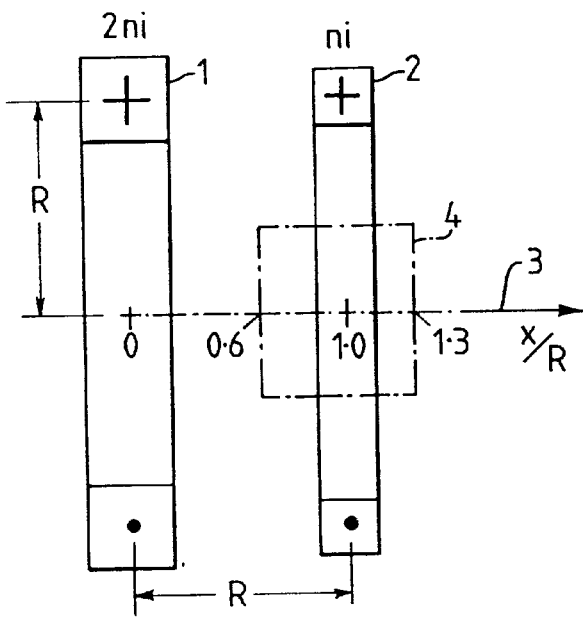
FIGS. 1 and 2 are diagrammatic representations of alternative electromagnet coil configurations which may be used to produce a magnetic field profile B(x) such that $[B(x)]^2$ varies as a linear function of distance x.

FIG. 1 shows in axial section two coils 1 and 2 which have the same mean radius R and are spaced a distance R apart on a common axis 3. Coil 1 will have twice the ampere-turns (ni) of coil 2, the current directions being the same so that their fields are in the same direction. If distance along the axis from the plane of coil 1 is denoted by x, this arrangement produces a magnetic field profile $B_{01}(x)$ such that $[B_{01}(x)]^2=b_1-a_1x$, where $b_1$ and $a_1$ are constants, for values of x in the range 0.6R<x<1.3R; this desired profile is provided within a cylindrical sample space indicated by the broken lines 4. Any nuclei with I=1 which are placed within this space will have precession rates and resonance frequencies $\omega_x$ which will vary as a linear function of the coordinate x, provided, where η<0.1, that the ratio $(GB \cos \theta/(\eta K))^2$ is much less than one.

Figure 2:
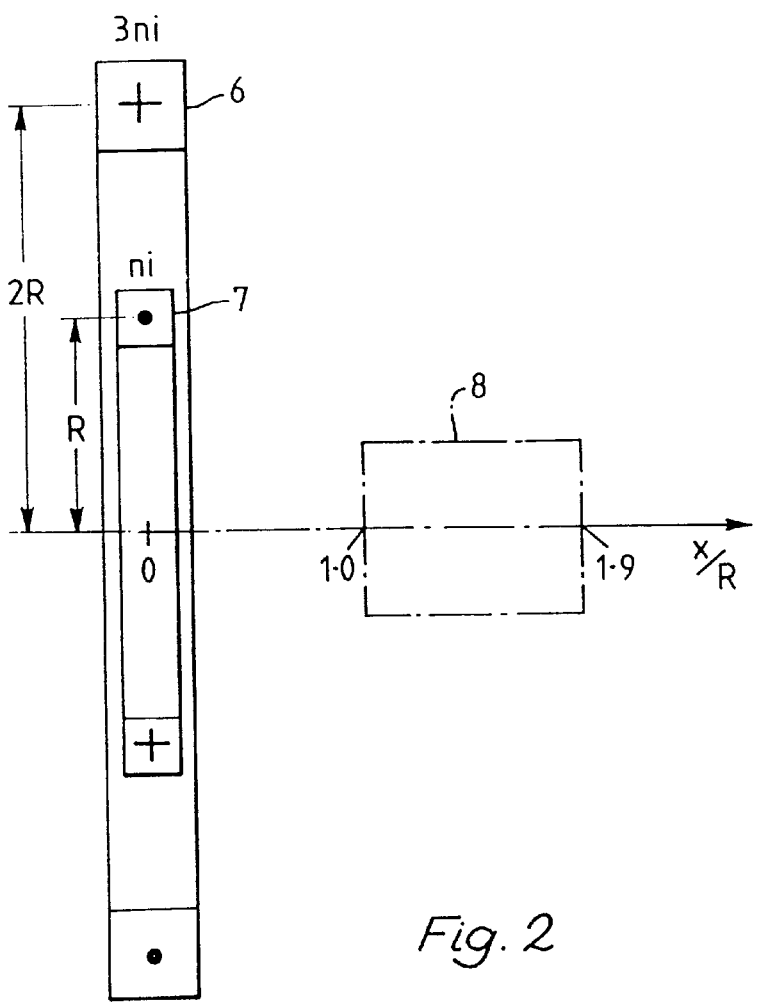

FIG. 2 shows two concentric coils 6 and 7 which have mean radii of 2R and R respectively. The ampere-turns (3ni) of the outer coil is three times the ampere-turns (ni) of the inner coil, and the field of the inner coil opposes the field of the outer coil. This arrangement produces a field profile $B_{02}(x)$ such that $[B_{02}(x)]^2=b_2-a_2x$ where $b_2$ and $a_2$ are constants, for values of x in the range R<x<1.9R. The desired profile is produced within a cylindrical space indicated by the broken lines 8 and again any nuclei in this volume with I=1 will have precession rates and resonance frequencies $\omega_x$ which will vary as a linear function of the coordinate x, with the proviso mentioned in the previous paragraph.

The arrangement of FIG. 1 will clearly require much less electrical power to establish a given range of magnetic field strengths than the arrangement of FIG. 2, but the fact that its sample space 4 lies mainly in the center of a coil and does not extend very far from the coil may be inconvenient for some applications. The FIG. 2 arrangement has the advantage that its useful sample space 8 is well separated from the coils and more accessible. This will make it more convenient for studies on human or animal patients. When the FIG. 2 configuration is used, it will be important to ensure that no part of the sample or body or any material which might have nuclear quadrupolar resonances in the frequency range being used should be present in the space where x<R, between the coils and the sample space 8, as this would produce confusing results in the same frequency range as the desired signal from the sample volume of the article or body under test.

The exact spacing size and power relationship of these coils is not critical and both designs may be varied to make the sample space size and position suitable for particular applications or to minimise the power required; many similar arrangements may be used to achieve similar results.

In both arrangements, slight adjustments to the number of ampere-turns and/or the relative disposition of the two coils can be made to accommodate slight deviations from precise $B^2$ dependence which may occur in particular compounds.

Figure 3:
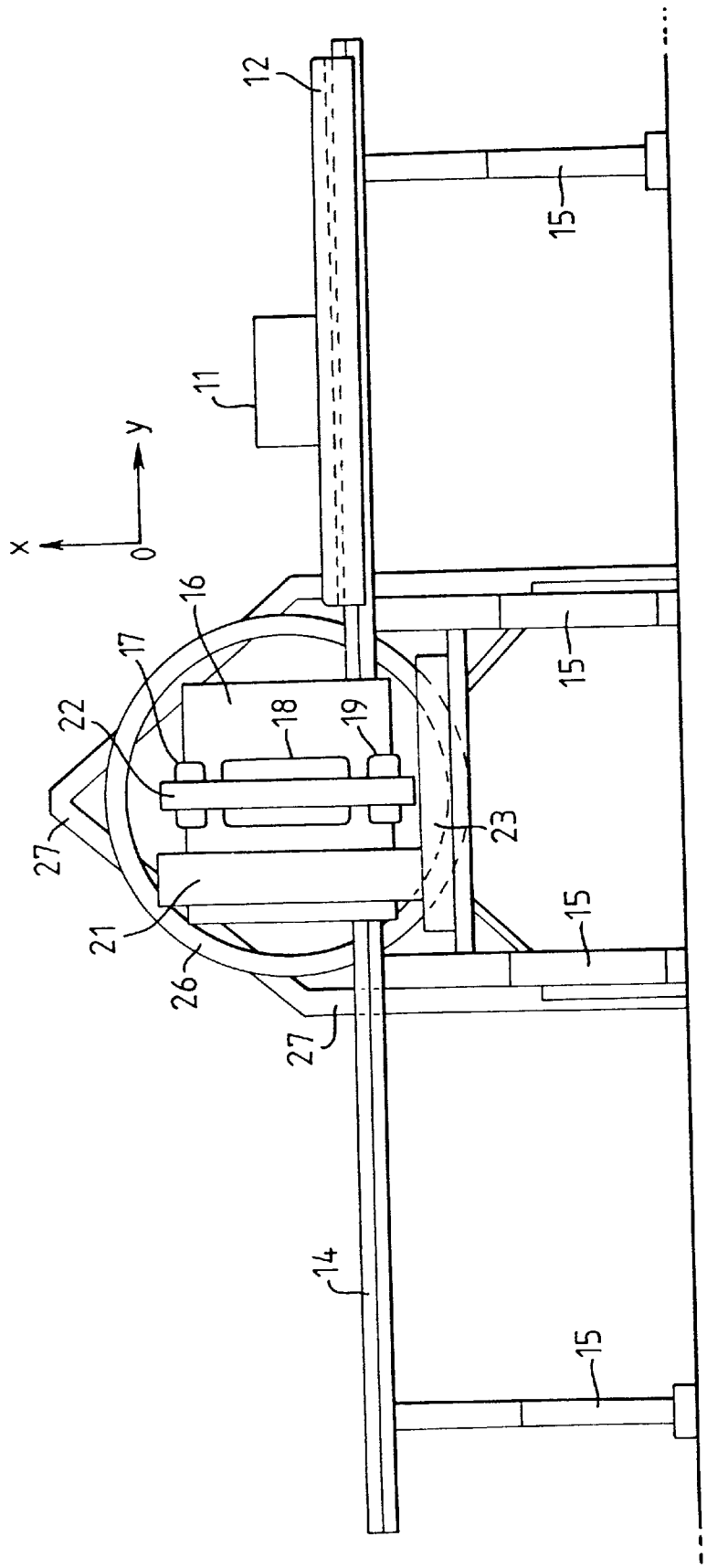
FIGS. 3 and 4, are, respectively, a front elevation and an end elevation of apparatus for NQR imaging.
Figure 4:
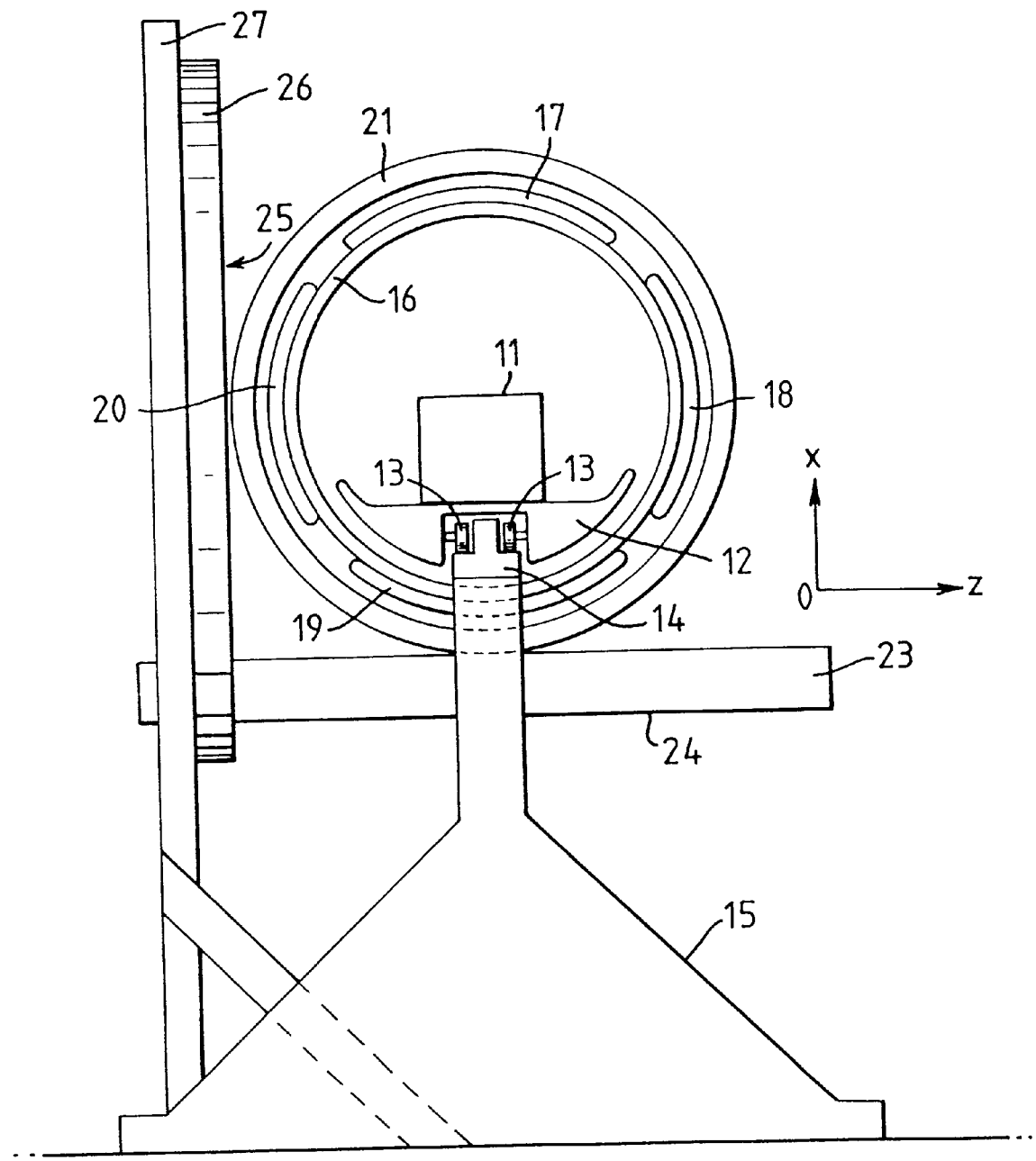

FIGS. 3 and 4 show a front elevation and an end elevation of apparatus for NQR imaging using coils in the configurations of FIG. 1 and FIG. 2 to produce appropriate magnetic field gradients in three orthogonal directions. For the sake of clarity the end elevation FIG. 4 is drawn to a larger scale than the front elevation FIG. 3.

A sample object 11 is placed on a cradle or platen 12 which runs on rollers 13 along a rail 14. The rail 14 is mounted on pedestals 15. An open-ended cylinder 16 of electrically insulating material surrounds a central portion of the rail so that the cradle 12 and sample objects 11 can pass through it. This serves to shield the sample objects from any malfunction such as arcing or fire which could occur from insulation failure or overheating in the electrical equipment, and it supports r.f. coils 17–20, with associated tuning components (not shown). These r.f. coils are saddle-shaped and mounted on the outside of the cylinder 16. They will be used to excite and to detect nuclear resonance signals. It may not be necessary to have two pairs of coils; one pair (17–19 or 18–20) may suffice or alternatively a tuned r.f. coil may be wound like a solenoid on the cylinder 16. The cradle 12, rail 14, cylinder 16 and other structural parts will be made of materials selected to avoid distortion of the magnetic or r.f. field and to avoid confusing resonances.

Two shielded electromagnet coils 21 and 22 are placed around the cylinder 16, to provide a magnetic field profile along the longitudinal direction of the rail 14, substantially in accordance with the principle of FIG. 1. The asymmetry of these coils should be noted; the smaller coil 22 is placed over the central part of cylinder 16 and the r.f. coils 17–20, and the larger coil 21 is displaced to one side by an amount equal to the mean radius of the coils.

Two concentric electromagnet coils 23 and 24 are supported in a horizontal plane centered just below the bottom of coil 22. The inner coil 24 is hidden by the outer coil 23. These coils will be used to provide a magnetic field profile in the vertical direction through the center of the volume within the cylinder 16. Two similar concentric coils 25 and 26 are mounted on a support structure 27, in a vertical plane immediately behind the coil 22. The inner coil 25 is hidden by the outer coil 26 in FIG. 4 and by the other components in FIG. 3. Both these coil pairs are arranged and used substantially in accordance with the principles of FIG. 2 but coil 23 is made a little smaller and coil 26 a little larger so that the rear of coil 23 can fit inside the lower part of coil 26. The coils 25 and 26 provide a magnetic field profile in a transverse horizontal direction. Positions within the sample space will be represented by orthogonal coordinates x, y and z in the directions indicated by axes Ox, Oy and Oz.

FIG. 5A–5C shows how the magnet currents may be varied in part of a typical cycle of tests. The traces show the current $i_x$ passed through the coils 25 and 26, the current $i_y$ passed through coils 21 and 22, and the current $i_z$ passed through the coils 23 and 24. The part of the cycle shown comprises six scanning periods in which the currents are held constant, separated by transition periods in which one current is decreased while another is increased. Each current varies from zero to a maximum value I. The annotations below the scanning periods indicate the directions of the field gradients produced, the notation xy indicating a gradient along the direction of the line x=y, z=0. The time scale of the whole cycle in medical applications will be determined by the maximum allowable rate of change of magnetic field to avoid any risk of adverse effects. The whole cycle may typically take from one to ten minutes and will include several hundred scan periods.

During each scan period a pair of the r.f., coils will be excited with pulses at a repetition rate determined by the relaxation times of the quadrupole frequency to be detected and of relative phases determined by the nature of the pulse cycle. For example, one half of the excitation pulses in each scan period (preferably alternate pulses) may be phase-inverted. The resulting free induction decay and/or echo signals will be sampled and measured in sampling periods occurring at a set time after each excitation pulse and before the next excitation pulse. Preferably fast digital sampling is used to take many measurements in each sampling period. Measurements made at corresponding times are accumulated and averaged but the responses from the phase-inverted excitations are subtracted from the responses to the non-inverted excitations. Quadrature phase-sensitive detection may be used. As explained in the co-pending U.K. Patent Application No. 91 06789.2, this substantially distinguishes the free induction decay responses from the aftermath of the excitation pulses. The results from each scan period are then Fourier transformed to get a projection of the desired image along a line parallel to the magnetic field gradient. Conventional data-processing is then used to derive the desired image or images from the many projections produced from a cycle of scan periods. The temperature of the object needs to be known, so that the r.f. excitation frequency can be adjusted appropriately prior to imaging.

The excitation pulses may have a duration of about 25 to 150 µs and the interval between consecutive excitation pulses τ may be in the range between $0.1T_1$ and $5T_1$ where $T_1$ is the spin-lattice relaxation time constant for the quadrupole-frequency concerned. In a typical case this interval may be from 1 ms to 100 ms. In another application, the interval between pulses τ is set to be much less than $T_2$ or $T_{2e}$, the spin-spin relaxation times for the quadrupole frequency concerned; strong off-resonant phase-alternated pulses are used and the echo signals between pulses are accummulated as described above. With a suitable design for the r.f. coils the peak r.f. power required to irradiate a sample volume of ½ liter may be less than 1 kW. The free induction decay signals may be sampled at a rate of 1 MHz and a number of samples may be taken from each decay signal. For measurements on $^{14}$N nuclei in collagen at room temperature the resonance frequencies are about 2.196 MHz and 2.945 MHz. The $^{14}$N nuclei have resonance frequencies at about 2.160 MHz and 2.850 MHz. The corresponding quadruple coupling constants and asymmetry parameters are 3.43 MHz (0.44) and 3.34 MHz (0.41).

Various modifications may be made to the equipment of FIGS. 3 and 4. To minimize the radiofrequency power required, and to reduce the exposure of the sample to radiofrequency radiation, it is preferable to have the r.f. coils as close as possible to the sample and hence they may be attached to surfaces of the sample. The cylinder 16 may then be omitted, making the sample space more accessible. The sample may be mounted on a turntable and the coils 21,22 omitted; then a modified cycle a part of which is shown in FIG. 6 may be used. The turntable will be rotated in incremental movements during the periods marked TR in FIGS. 6A–6B to obtain three-dimensional information without using a field profile in the $O_y$ direction.

For imaging samples which may have significantly inhomogeneous temperature distributions, it is necessary to do tests with complementary magnetic field profiles. With some samples this may be done by inverting and rotating the article, or by rotating the coils 23,24,25 and 26 and their support structure through 180° about a horizontal axis through the center of the sample space, but where this is inconvenient it may be desirable to provide extra magnet coils to produce complementary magnetic field profiles. The coils shown in FIGS. 3 and 4 will of course always provide higher field strength towards the left or bottom as shown in the drawings. The extra coils needed would be provided above, in front and to the right of the sample space, symmetrical with the coils already shown in FIGS. 3 and 4. With appropriate precautions this form of the invention may be suitable for imaging parts of human limbs or even complete human or animal bodies.

Figure 7:
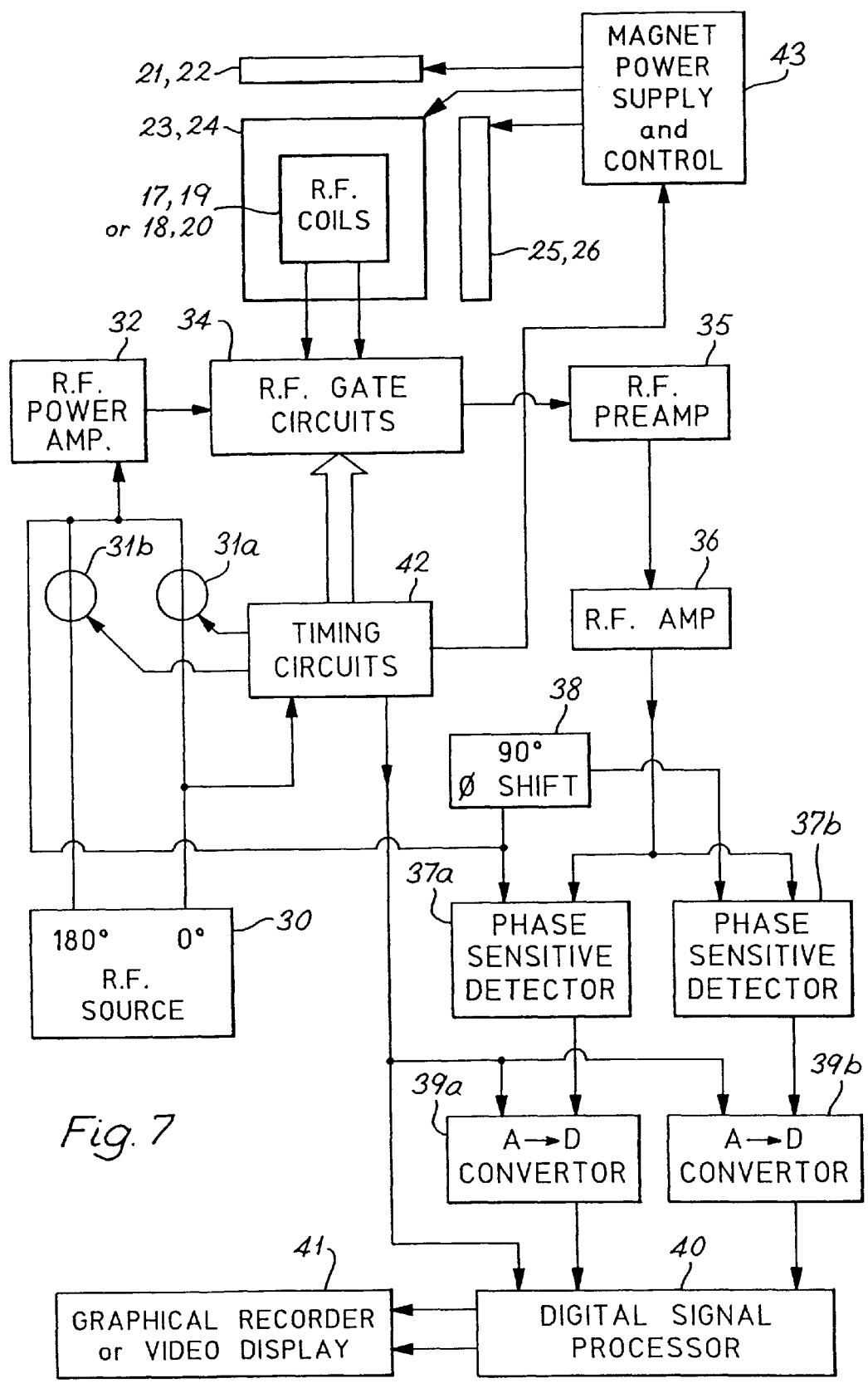
FIG. 7 is a block circuit diagram of electrical equipment.

FIG. 7 is a block circuit diagram showing electrical equipment for NQR imaging. A radiofrequency source 30 producing a single radiofrequency has normal and inverted-phase outputs connected through gates 31a and 31b to an r.f. power amplifier 32. Radiofrequency gate circuits 34 connect the power amplifier output to the r.f. coils 17,19 or 18,20 and also connect the r.f. coils through an r.f. preamplifier 35 and amplifier 36 to phase sensitive detectors 37a and 37b. The output of gates 31a and 31b is connected as a reference signal to the detector 37a and through a 90° phase shift circuit to the detector 37b. Outputs from the detectors 37a and 37b are sampled and digitised by analogue to digital convertors 39a and 39b and then passed to a digital signal processor 40. Image information derived by the processor 40 is applied to a graphical recorder or video display 41. Timing circuits 42 control the gates 31a. 31b and 34 and also supply timing signals to the convertors 39a and 39b and the processor 40. The timing circuits 42 also control a filtered and stabilised power supply 43 which supplies and controls the currents in the magnet coils 21–22, 23–24 and 25–26.

For imaging nuclei in the particular circumstances described above where a linear magnetic field profile is required, this profile can be provided by coils in the anti-Helmholtz or Maxwell configuration—two coils of radius R, spaced R apart and connected to produce opposing fields. A system providing linear gradient fields in three orthogonal directions will have three pairs of identical coils symmetrically arranged about the sample space. In such a system complementary magnetic field profiles can be provided by simply reversing the direction of the currents. Such systems can provide a relatively inexpensive and simple method of imaging.

The further aspect of the invention relating to a method of and apparatus for NQR testing and to a method of and apparatus for detecting the presence of a particular substance containing a given species of quadrupolar nucleus is now discussed.

Suitable timing diagrams for putting this invention into effect are shown in FIGS. 8A–8D. The diagrams show excitations and excitation responses at two resonance frequencies. Referring to a first embodiment shown in FIG. 8A–8B, two radiofrequency pulses of width $t_w$ and of differing frequencies $f_1$ and $f_2$ are repeated at a pulse repetition time $\tau$ ($\tau \gg t_w$) which is much longer than the spin-lattice relaxation time $T_1$—say $\tau = 5T_1$—to ensure full signal recovery between pulses; phase shifts of alternate pulses or suitable combinations of pulses of width $t_w$ and $2t_w$ may be used to eliminate probe ringing. After phase-sensitive detection and manipulation of the appropriate signals during each repetition, the residual oscillations can be made to cancel and only the true NQR free induction decay (f.i.d.) response signals from the two resonances are observed The response signals are summed over the number of repetitions of the test. Sums from the two individual resonance frequencies may be maintained, or else a sum of all the response signals may be maintained. The pulses at the different frequencies are slightly staggered to avoid any problems with mixing due to non-linearities in the r.f. probe. However, the pulses could be simultaneous, or a frequency modulated or frequency swept (adiabatic) pulse could be utilised.

In an alternative form of this first embodiment, the pulse repetition time $\tau$ is made less than $5T_1$, and the pulse width and/or r.f. power adjusted to produce flip angles ($\alpha$) which are less than $\alpha_m$ (the flip angle to produce the maximum f.i.d.). The signals are weaker than when $\tau/T_1 \approx 5$, but more can be accumulated in a given time and a lower r.f. power is required.

Figure 8A:
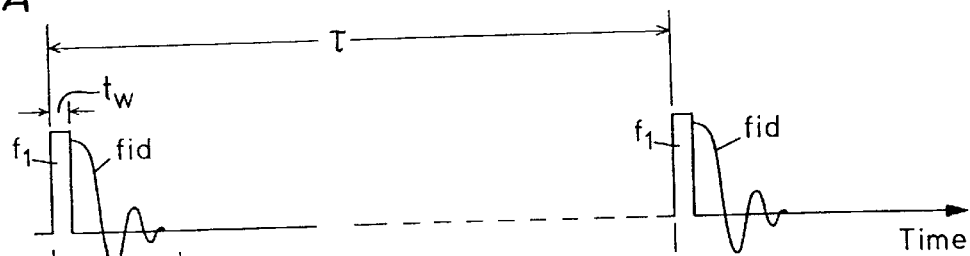
FIGS. 8A–8D are timing diagrams for an embodiment of the invention.
Figure 8B:
Figure 8C:
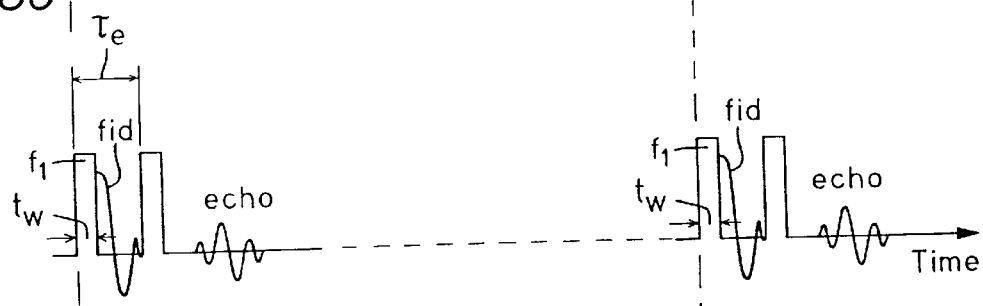
Figure 8D:
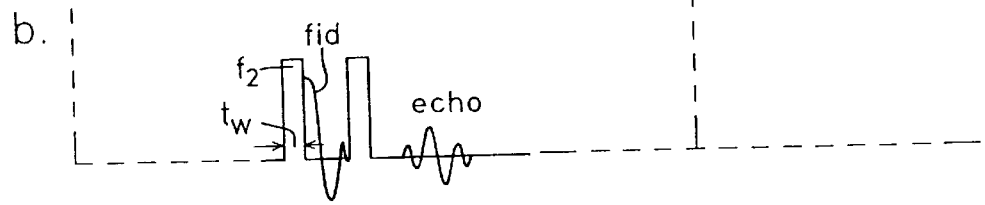

In a second embodiment of the invention shown in FIGS. 8C–8D, two series of excitation pulses are applied at two respective different frequencies $f_1$ and $f_2$ and at suitable spacings ($\tau_e$) to excite separate echoes. As with the two forms of the first embodiment, the pulse repetition time can be equal to or less than $5T_1$. Again, the pulses at the different frequencies are shown staggered, although they could be simultaneous.

The further aspect of the invention may suitably be put into effect using the apparatus shown in FIG. 7 and described previously. It will be appreciated that the apparatus needs to be capable of producing radiofrequency irradiation at a plurality of frequencies. This may necessitate the provision of, for example, one set of phase sensitive detectors, one coil and one gate circuit for each of the frequencies; alternatively, some retuning of these components for the different frequencies may suffice.

It will also be appreciated that, if the invention is applied just to detection of the presence of NQR substances rather than to imaging such substances, the digital signal processor 40 needs to be capable of processing the NQR response signals to produce an alarm signal in the appropriate circumstances. The magnet coils 21–22, 23–24 and 25–26 and the magnet power supply and control 43 would be unnecessary but a visual or audible alarm activated by the alarm signal would need to be provided.

It will be understood that the invention has been described above purely by way of example, and modifications of detail can be made within the scope of the invention.

We claim:

1. A method of imaging within a sample space an object containing quadrupolar nuclei, comprising:

irradiating the object to excite nuclear quadruple resonance, applying to the object a magnetic field gradient having a profile B such that $B^n$ varies linearly with distance, n being greater than one, detecting resonance response signals from the nuclei, and deriving an image from the response signals.

2. A method according to claim 1 wherein n is two.

3. A method according to claim 1, wherein the magnetic field profile is produced by the combined effects of a central coil centered around the sample space and at least one offset coil coaxial with the central coil and offset to one side of the sample space, the total ampere-turns product of each offset coil being substantially greater than the ampere-turns product of the central coil, the fields of the offset coils and central coils acting in the same direction.

4. A method according to claim 1 wherein the magnetic field profile is produced by the combined effect of two coils of different diameters, both offset to one side of the sample space, the ampere-turns product of the larger coil being substantially greater than the ampere-turns product of the smaller coil, the field of the smaller coil opposing the field of the larger coil.

5. A method according to claim 1 further including:

detecting a variation of temperature within the sample space and comparing the results of a first set of tests with the magnetic field profile increasing in one direction and a second set of tests with the magnetic field profile increasing in an opposite direction.

6. A method according to claim 1 wherein tests are done in a sequence of magnetic field gradients in different directions and the image is derived by a projection-reconstruction method.

7. A method according to claim 6 wherein the magnetic field gradients are applied sequentially in at least three orthogonal directions.

8. A method according to claim 6 wherein the magnetic field gradients are applied sequentially in two orthogonal directions and the article is rotated incrementally about one of these directions during the sequence of tests.

9. A method for producing an image representing one of the distribution of a specific substance containing quadrupolar atomic nuclei of spin quantum number $I \leq 1$ and local temperatures within a sample volume in an article, comprising:

irradiating the sample volume of the article with pulses of radio frequency electromagnetic energy at least close to a quadruple resonance frequency of the atomic nuclei in the presence of at least one magnetic field gradient having a profile which produces a variation of the resonance frequency which is substantially a linear function of distance in a direction of the magnetic field gradient within a sample volume of the article, measuring response signals from the nuclei, and deriving the image by data-processing the results of many such measurements, wherein the magnetic field profile is a function $B_o(x)$ of distance x such that its square $(B_o(x))^2$ is a linear function of x, within a limited sample volume of the article.

10. Apparatus for imaging within a sample space an object containing quadrupolar nuclei, comprising:

means for irradiating the object to excite nuclear quadruple resonance, application means for applying to the object a magnetic field gradient having a profile B such that $B^n$ varies linearly with distance, n being greater than one, means for detecting resonance response signals from the nuclei, and means for deriving an image from the response signals.

11. Apparatus according to claim 10 wherein n is two.

12. Apparatus according to claim 10 wherein the application means includes a central coil centered around the sample space and at least one offset coil offset to one side of the sample space, connected to produce fields in the same direction.

13. Apparatus according to claim 12 wherein each offset coil has substantially more turns than the central coil.

14. Apparatus according to claim 10 wherein the application means includes a central coil centered around the sample space and an offset coil of substantially the same radius but having twice the turns of the central coil and offset to one side by a distance approximately equal to the mean radius of the central and offset coils.

15. Apparatus according to claim 10 wherein the application means includes two coils of different radii on a same axis, both offset to one side of the sample space and connected so that a field of a smaller coil opposes a field of a larger coil in the two coils of different radii.

16. Apparatus according to claim 15 wherein the larger radius coil has substantially more turns than the smaller radius coil.

17. Apparatus according to claim 10 wherein the application means includes at least two sets of electromagnetic coils arranged to provide magnetic field gradients in at least two orthogonal directions.

18. Apparatus according to claim 15 wherein the application means further includes a turntable placed below the sample space.

19. Apparatus according to claim 11 wherein the application means includes a central coil centered around the sample space and at least two offset coils offset to opposite sides of the sample space, and means for energizing each offset coil on either side in conjunction with the central coil to produce complementary variations of $B^2$ over the sample space.

20. Apparatus according to claim 11 wherein the application means includes two coils of different radii offset to one side of the sample space and two coils of different radii offset to the opposite side of the sample space, and means for energizing the coils on one side or the other to provide complementary variations of $B^2$ over the sample space.

21. Apparatus for producing an image representing a distribution of a specific substance containing one of quadrupolar atomic nuclei of spin quantum number $I \geq 1$ and local temperatures within a sample volume in an article, comprising:

means for irradiating a sample space with pulses of radio frequency electromagnetic energy at least close to a quadruple resonance frequency of the said atomic nuclei, electromagnetic coils arranged for producing at least one magnetic field gradient across the sample space of a profile appropriate to produce a variation of the resonance frequency which will be a linear function of distance across the sample space in the direction of the magnetic field gradient, means for measuring response signals from the atomic nuclei, and data-processing means for deriving the image from the results of many such measurements, the electromagnetic coils being arranged to produce a magnetic field which is a function $B_o(x)$ of distance x such that its square $(B_o(x))^2$ is a linear function of x, within a limited sample volume of the article.

22. Apparatus according to claim 10 further comprising:

means for applying to the object a magnetic field gradient having a profile which varies linearly with distance.

* * * * *